United States Patent
Verma et al.

(10) Patent No.: US 11,016,135 B2
(45) Date of Patent: May 25, 2021

(54) SYSTEMS AND METHODS FOR GROUND FAULT DETECTION IN POWER SYSTEMS USING COMMUNICATION NETWORK

(71) Applicant: Cummins Power Generation IP, Inc., Minneapolis, MN (US)

(72) Inventors: Shubhranshu Verma, Shoreview, MN (US); Julie M. Delago, Afton, MN (US)

(73) Assignee: Cummins Power Generation IP, Inc., Minneapolis, MN (US)

( * ) Notice: Subject to any disclaimer, the term of this patent is extended or adjusted under 35 U.S.C. 154(b) by 251 days.

(21) Appl. No.: 16/202,571

(22) Filed: Nov. 28, 2018

(65) Prior Publication Data

US 2020/0166557 A1 May 28, 2020

(51) Int. Cl.
*G01R 31/08* (2020.01)
*H02H 1/00* (2006.01)
*H02H 3/16* (2006.01)

(52) U.S. Cl.
CPC ......... *G01R 31/086* (2013.01); *G01R 31/088* (2013.01); *H02H 1/0007* (2013.01); *H02H 3/16* (2013.01)

(58) Field of Classification Search
CPC .. G01R 31/016; G01R 31/085; G01R 31/086; G01R 31/088; H02H 1/00; H02H 1/007; H03H 3/16; H03H 3/162; H03H 3/165
See application file for complete search history.

(56) References Cited

U.S. PATENT DOCUMENTS

| | | | |
|---|---|---|---|
| 3,949,272 A | 4/1976 | Smith | |
| 4,321,645 A * | 3/1982 | Thom | H02H 7/062 361/63 |
| 6,731,098 B1 | 5/2004 | Hintz et al. | |
| 7,692,332 B2 | 4/2010 | Nordman et al. | |
| 7,719,285 B2 | 5/2010 | Johansson et al. | |

(Continued)

FOREIGN PATENT DOCUMENTS

CA 2186988 4/1997

OTHER PUBLICATIONS

Griffin et al., "Generator Ground Fault Protection Using Overcurrent, Overvoltage, and Undervoltage Relays", IEEE Transactions on Power Apparatus and Systems, Dec. 1982, pp. 4490-4501.
Kumar et al., "A Fast and Scalable Protection Scheme for Distribution Networks with Distributed Generation", IEEE Transactions on Power Delivery, vol. 31, No. 1, Feb. 2016, pp. 67-75.
Pierce, A.C., "Generator Ground Protection Guide", IEEE Transaction on Power Apparatus and Systems, vol. PAS-103, No. 7, Jul. 1984, pp. 1743-1748.

(Continued)

*Primary Examiner* — Adolf D Berhane
(74) *Attorney, Agent, or Firm* — Foley & Lardner LLP

(57) ABSTRACT

Systems, methods, storage media, and computing platforms for determining a fault in a power system, executing on a controller are disclosed. Exemplary implementations may: receive a first value of current flow from a first current sensor installed on a first bus of the power system; receive a second value of current flow from a second current sensor installed on a second bus of the power system; determine a first direction of power flow in the first current sensor using the first value of current flow; determine a second direction of power flow in the second current sensor using the second value of current flow; and determine a power fault is located on one of the first bus of the power system or the second bus of the power system based on the first direction of power flow and the second direction of power flow.

22 Claims, 7 Drawing Sheets

(56) References Cited

U.S. PATENT DOCUMENTS

| | | | |
|---|---|---|---|
| 7,995,315 B2 | 8/2011 | Riley et al. | |
| 8,405,940 B2 | 3/2013 | Schweitzer et al. | |
| 8,547,668 B2 * | 10/2013 | Dahlen | H04B 3/544 |
| | | | 361/20 |
| 8,590,033 B2 * | 11/2013 | Schleiss | G05B 19/0428 |
| | | | 726/13 |
| 9,500,710 B2 | 11/2016 | Thompson et al. | |
| 9,837,812 B2 | 12/2017 | Valdes et al. | |
| 2004/0010349 A1 | 1/2004 | Perez et al. | |
| 2010/0008000 A1 | 1/2010 | Riley et al. | |
| 2011/0018340 A1 * | 1/2011 | Patterson | H02J 7/1438 |
| | | | 307/10.1 |
| 2012/0147508 A1 | 6/2012 | Starkweather | |
| 2018/0323611 A1 * | 11/2018 | Gubba Ravikumar | |
| | | | H02J 13/00017 |
| 2019/0081582 A1 * | 3/2019 | Rozman | H02K 21/24 |
| 2020/0141993 A1 * | 5/2020 | Nikic | G03G 13/025 |
| 2020/0182934 A1 * | 6/2020 | Chai | H02M 1/32 |

OTHER PUBLICATIONS

Pillai et al., "Grounding and Ground Fault Protection of Multiple Generator Installations on Medium-Voltage Industrial and Commercial Power Systems", IEEE Transactions on Industry Applications, vol. 40, No. 1, Jan./Feb. 2004, 26 pages.

Pope, J.W., "A Comparison of 100% Stator Ground Fault Protection Schemes for Generator Stator Windings", IEEE Transactions on Power Apparatus and Systems, Apr. 1984, pp. 832-840.

Rifaat, Rasheek M., "Consideration for Generator Ground Fault Protection in Mid Size Cogeneration Plants", IEEE, 1995, pp. 175-182.

Sortomme et al., "Microgrid Protection Using Communication-Assisted Digital Relays", IEEE Transactions on Power Delivery, vol. 25, No. 4, Oct. 2010, pp. 2789-2796.

International Search Report and Written Opinion for International Application No. PCT/US2019/063267, dated Feb. 11, 2020, 11 pages.

* cited by examiner

SYSTEMS AND METHODS FOR GROUND FAULT DETECTION IN POWER SYSTEMS USING COMMUNICATION NETWORK

TECHNICAL FIELD

The present disclosure relates to power systems.

BACKGROUND

Many electric power systems include two or more generators for additional power, redundancy, and/or safety. Both businesses and households rely on electrical equipment powered from one-phase, two-phase, three-phase, or other suitable utility-provided alternating-current (AC) power sources. Detecting locations of power faults to ground in systems with a plurality of generators or other power sources can require considerable additional equipment and associated cost, particularly when differing or incompatible equipment from different vendors is utilized. As a result, many power systems do not have the required sensing capability to determine the type and location of a fault and be able to react appropriately.

SUMMARY

One aspect of the present disclosure relates to a system configured for determining a fault in a power system, executing on a controller. The system may include a plurality of generators operatively connected to a respective bus, a respective line current sensor between each respective bus of each generator and a load bus, and a respective high-speed network device operatively coupled to each respective line current sensor. In some implementations, the system may further comprise a respective line current sensor between a neutral bus and each of a respective bus of each of the plurality of generators. In some implementations, the system may further comprise one or more controllers configured to determine a location of a power fault based on respective directions of power flow at each respective line current sensor, wherein associated respective directions of power flow are received from each respective high-speed network device operatively coupled to each respective line current sensor. In some implementations, the system may further comprise one or more controllers configured to determine a location of a power fault based on respective directions of power flow at each respective line current sensor, wherein associated current values are received from each respective high-speed network device operatively coupled to each respective line current sensor. In some implementations, the system may further comprise one or more controllers configured to determine no power fault present in the power system based on respective directions of power flow at each respective line current sensor, wherein associated current values are received from each respective high-speed network device operatively coupled to each respective line current sensor. In some implementations, the current values measured by the line current sensors are only received from the network devices when the current values are above a threshold value.

In some implementations, the system further comprises a line current sensor between neutral and ground for an isolated bus. The one or more controllers may be further configured to receive a first value of current flow from a first line current sensor installed between a neutral bus and a first neutral bus of a first generator of the plurality of generators, receive a second value of current flow from a second line current sensor installed between the neutral bus and a second neutral bus of a second generator of the plurality of generators, receive a third value of current flow from the line current sensor between neutral and ground, determine a first direction of power flow in the first line current sensor using the first value of current flow, determine a second direction of power flow in the second line current sensor using the second value of current flow, determine a third direction of power flow in the second line current sensor using the third value of current flow, and determine a power fault is located on one of a generator bus of the first generator, a generator bus of the second generator system or the load bus of the power system based on the first direction of power flow, the second direction of power flow, and the third direction of power flow.

Another aspect of the present disclosure relates to a method for determining a fault in a power system. The method may include receiving a first value of current flow from a first current sensor installed on a first bus of the power system. The method may include receiving a second value of current flow from a second current sensor installed on a second bus of the power system. The method may include determining a first direction of power flow in the first current sensor using the first value of current flow. The method may include determining a second direction of power flow in the second current sensor using the second value of current flow. The method may include determining a power fault is located on one of the first bus of the power system or the second bus of the power system based on the first direction of power flow and the second direction of power flow. In some implementations, the first value indicative of current flow from the first current sensor and the second value indicative of current flow from the second current sensor are one of (1) a respective value of an amount of current or (2) a respective value of current flow direction.

In some implementations, the method may further comprise receiving a third value indicative of current flow from a third current sensor installed on a third bus of the power system, receiving a fourth value indicative of current flow from a fourth current sensor installed on a fourth bus of the power system, receiving a fifth value indicative of current flow from a fifth current sensor installed on a fifth bus of the power system, determining a third direction of power flow in the third current sensor using the third value indicative of current flow, determining a fourth direction of power flow in the fourth current sensor using the fourth value indicative of current flow, and determining a fifth direction of power flow in the fifth current sensor using the fifth value indicative of current flow. The first bus may be a generator bus, the second bus may be a generator neutral bus, the third bus may be a utility bus, the fourth bus may be a utility neutral bus, and the fifth bus may be a tie bus. The method may then further comprise determining a power fault is located on one of the generator bus, a load bus, or the utility bus based on the first direction of power flow, the second direction of power flow, the third direction of power flow, the fourth direction of power flow, and the fifth direction of power flow.

Yet another aspect of the present disclosure relates to a non-transient computer-readable storage medium having instructions embodied thereon, the instructions being executable by one or more processors to perform any of the methods above.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

Figure 1:
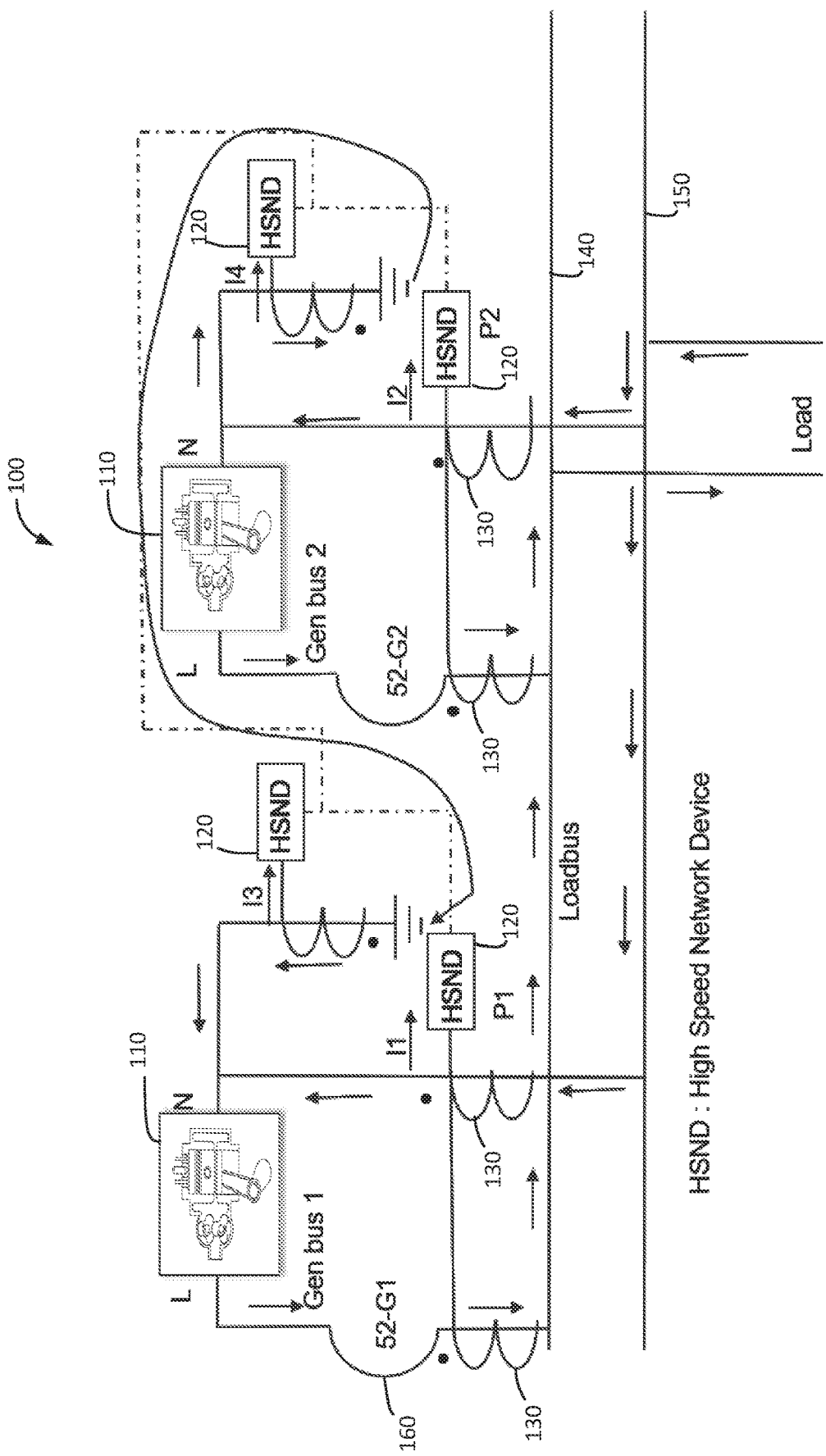
FIG. 1 is a schematic diagram showing normal current flow in a power system according to an example implementation.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS IMPLEMENTATIONS

Implementations described herein relate generally to systems and methods for ground fault detection in power systems using a communication network. In some implementations, the systems and methods presented allow for the accommodation of different types of switchgear potentially from different vendors. In some implementations, the systems and methods presented allow for the elimination of requirements to add summing modules as there is no hard-wire interconnection required between generators and switchgear systems.

The circuits and systems described in the figures are for example purpose only. It should be apparent to a person of skill in the art that other circuits and systems demonstrating one or more of the solutions discussed are possible and that these solutions as well as the illustrated circuits and systems are scalable. Further, it should be apparent to a person of skill in the art that the circuits and systems discussed are adaptable to various configurations of the switchgear used. While circuits illustrating two different circuit topologies are illustrated and discussed, circuits and systems demonstrating one or more of the solutions discussed are not limited to these two circuit topologies.

FIG. 1 is a schematic diagram showing normal current flow in a common bus generator power system 100 utilizing High-Speed Network Devices (HSND) for sensing bus and ground fault currents according to an example implementation. The power system 100 shows two power generators 110 each with a corresponding generator bus, various line current sensors 130 (e.g., current transducers), high-speed network devices 120 communicatively coupled to one or more of the line current sensors 130, circuit breakers 160, a load bus 140, and a neutral bus 150. Each bus may represent one or more phases of power (e.g. three phase power). In an example implementation, power system 100 shows current sensors 130 installed between the neutral/ground bonds of each generator and on the buses from the load and neutral of each generator to the respective load bus 140 and neutral bus 150. There is a 'dot' placed on the current sensors 130 which indicate that when current flows through the 'dot' into the current sensor 130, the current is considered positive and when current enters the current sensor 130 from the other side and leaves the current sensor 130 through the 'dot' the current is considered negative as the direction of the current is reversed. The voltage term 'V' used may be the average or rms voltage of the bus voltage and the line side voltage of the power generators 110. In case any of the voltage is zero then it may be ignored from the calculation. It is noted that additional generators can be added to the common bus embodiment shown in FIG. 1 and are contemplated. It is also noted that the use of High-Speed Network Devices (HSND) for sensing bus and ground fault currents via coupled current transformers (CT) enables the use of power equipment from differing manufacturers, allowing the control to be independent of the system components.

FIG. 1 shows an example implementation of a common bus generator installation with normal current flow. Normal current flow can be analyzed in a controller (e.g., a computing device such as controller 700 of FIG. 7). In one implementation, currents are analyzed with I1 representing the current flow through the line current sensors 130 on the line and neutral buses of the first generator with I1 being the vector sum of the currents shown. The high-speed network device 120 communicatively coupled to these respective line current sensors 130 may be configured to communicate the current flow information to one or more other high-speed network devices 120 and/or a controller (e.g., a computing device such as controller 700).

The controller may be configured to calculate the power flow through the line current sensors 130 on the line and neutral buses of the first generator as $P1=V*I1*\cos \varnothing 1$, wherein Ø1 is the angle between the respective bus voltage 'V' and I1, indicating the real power. The current is entering the line current sensors 130 through the 'dot' (using dot convention transformer notation, where +ve indicate the direction of the current or power flow and relative magnitude from the in-phase induced voltages with regards to the dot notation of the current transformer sensor (CT), i.e., into the dot, and −ve indicates a negative current or power flow and relative magnitude) and all current does not return through the neutral current sensor 130 with opposite polarity. Some of the return current flows through the N-G bond on the G2 (current I4) and N-G bond on the G1 (current I3), particularly when fault conditions are present. As there will be +ve difference sensed in the outgoing current between the line (L) side line current sensors 130 and the returning current on the neutral current (N) sensors 130 of first generator (G1), the total current I1 is considered +ve. Current flowing from the first generator to a load bus 140 may be represented as +ve.

Currents may be further analyzed with I2 representing the current flow through the line current sensors 130 on the line and neutral buses of the second generator (G2) with I2 being the vector sum of the currents shown. The high-speed network devices 120 communicatively coupled to these respective line current sensors 130 can be configured to communicate the current flow information to one or more other high-speed network devices 120 and/or a controller (e.g., a computing device such as controller 700).

The controller may be configured to calculate the power flow through the line current sensors 130 on the line and neutral buses of the second generator as P2=V*I2*cos Ø2, wherein Ø2 is the angle between the respective bus voltage 'V' and I2. The current is entering the line side line current sensor 130 through the 'dot'. The return current in the neutral current sensor 130 is opposite and leaving through the 'dot'. The current through the neutral is more than the line current because some of the G1 current which flows through the Neutral-Ground (N-G) bonds for G1 and G2 also flows through the neutral current sensor 130 of the G2 (see FIG. 1). Therefore, there will be negative difference in currents between the outgoing line (L) side line current sensors 130 and the returning neutral current (N) sensor 130 of the G2. Therefore, I2 may be considered −ve. Current flowing from the second generator to a load bus 140 may be represented as −ve.

Currents may be further analyzed with I3 representing the current flow through the line current sensor 130 on the bus connecting neutral to ground (N-G bond) for the first generator. The high-speed network device 120 communicatively coupled to this respective line current sensor 130 can be configured to communicate the current flow information to one or more other high-speed network devices 120 and/or a controller (e.g., a computing device such as controller 700).

Return Current flowing from the neutral bus 150 to the N-G bond of G2, to the N-G bond of G1, to G1 is considered +ve as it enters the N-G bond of G1 through the 'dot'.

Currents may be further analyzed with I4 representing the current flow through the line current sensor 130 on the bus connecting neutral to ground for the second generator. The high-speed network device 120 communicatively coupled to this respective line current sensor 130 can be configured to communicate the current flow information to one or more other high-speed network devices 120 and/or a controller (e.g., a computing device such as controller 700).

Return current flow from the load to the neutral bus 150, to the N-G bond of G2 is considered −ve as it leaves the N-G CT of G2 through the 'dot'. This current eventually returns to G1 through N-G bond on G1.

Under normal conditions when P1+P2=0 and I3+I4 is zero, there is no power fault in the system.

Figure 2:
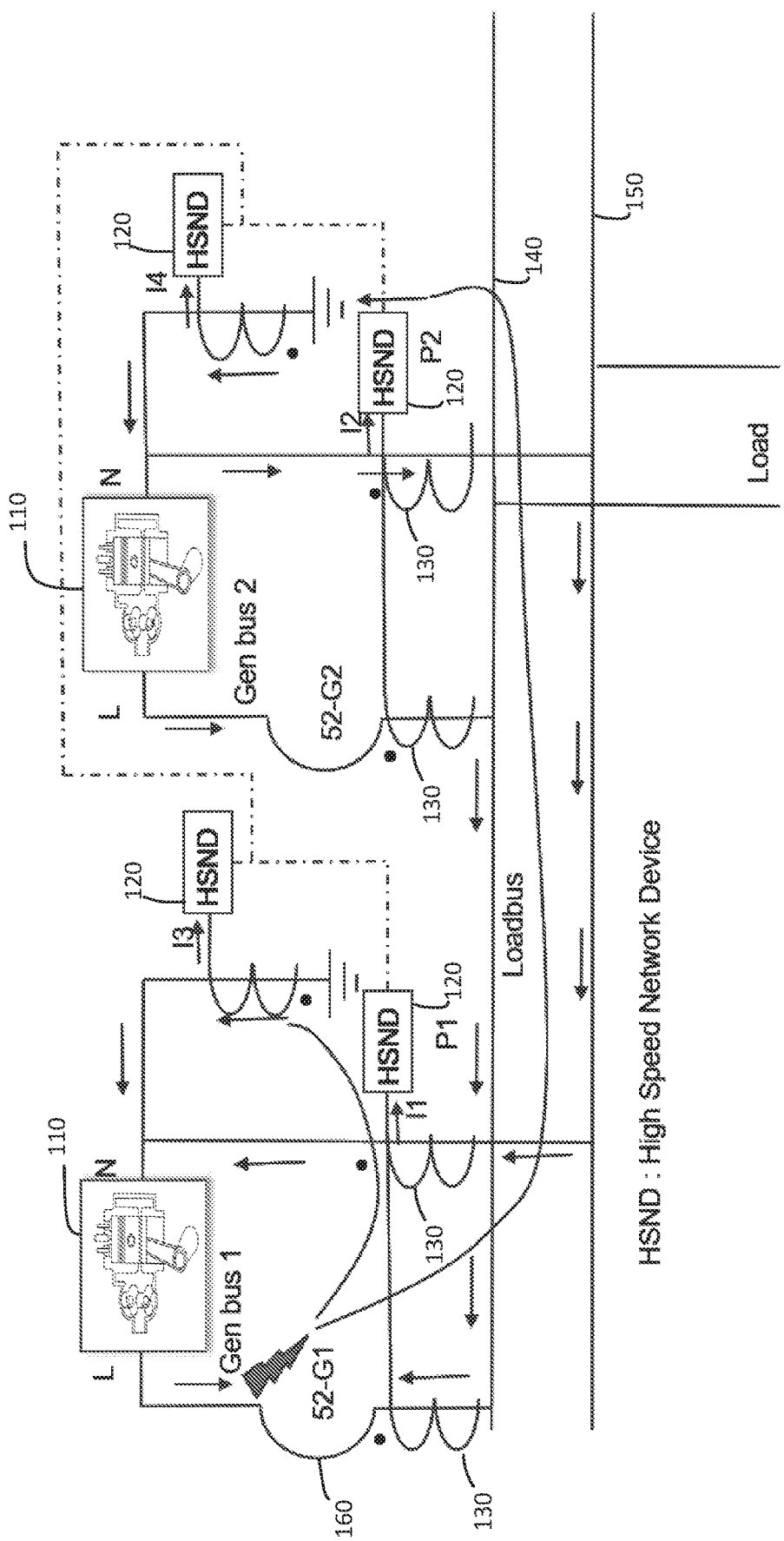
FIG. 2 is a schematic block diagram showing current flow with a ground fault on a first generator bus in a power system according to an example implementation.

FIG. 2 is a schematic diagram showing current flow in a common bus power system 200 with an illustrated power fault on the load bus line for the first generator 110 according to an example implementation. The power system 200 shows two power generators 110 each with a corresponding generator bus, various line current sensors 130, high-speed network devices 120 communicatively coupled to one or more of the line current sensors 130, circuit breakers 160, a load bus 140, and a neutral bus 150. Each bus may represent one or more phases of power (e.g. three phase power). In an example implementation, power system 200 shows current sensors 130 installed between the neutral/ground bonds of each generator and on the buses from the load and neutral of each generator to the respective load bus 140 and neutral bus 150.

Figure 7:
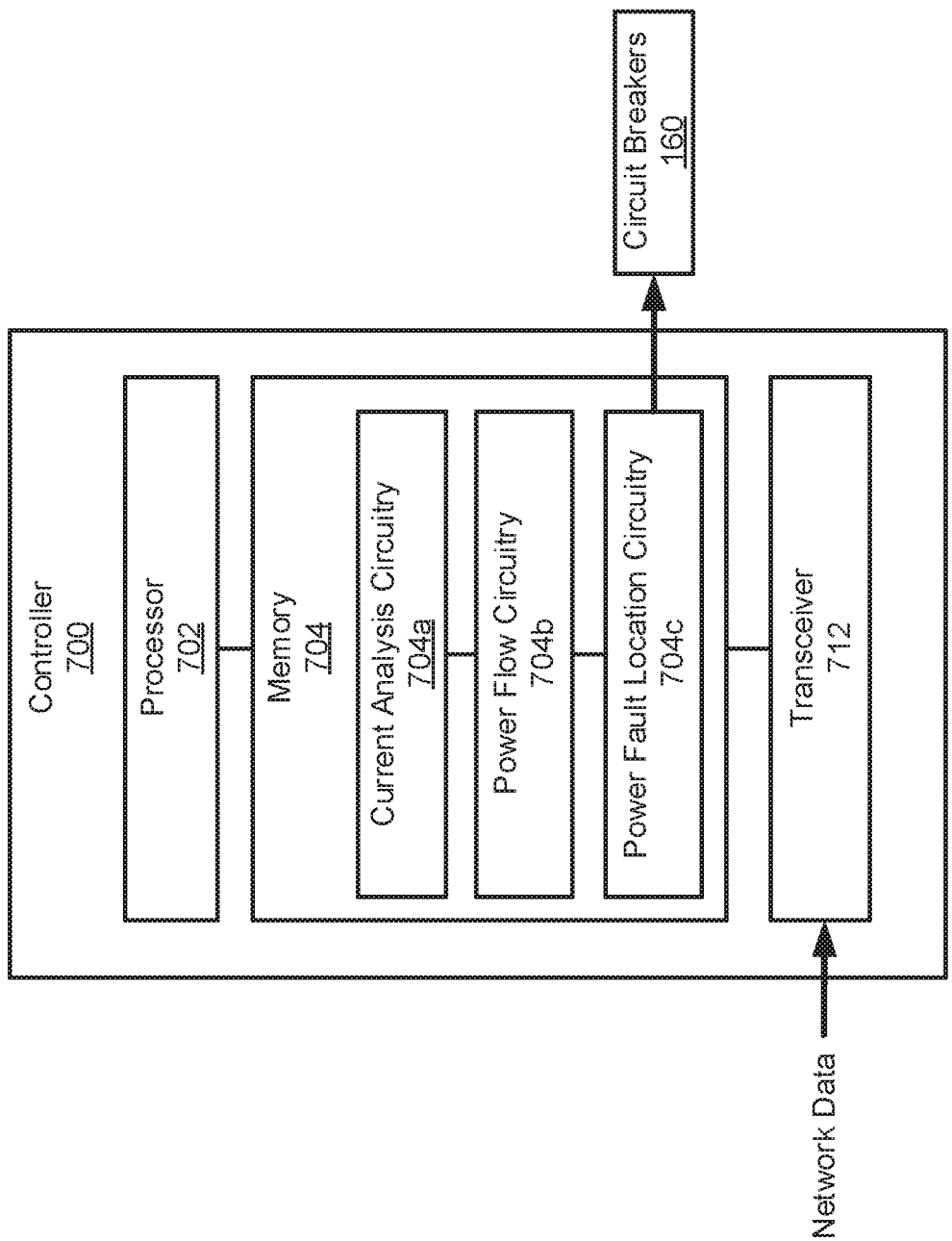
FIG. 7 is a schematic block diagram of an implementation of a controller which can be used as an example controller as part of various systems and methods of FIGS. 1-6.

FIG. 2 shows an example implementation with a power fault (short to ground) on the first generator (G1) load bus compromising normal current flow. The current flow in these conditions can be analyzed in a controller (e.g., a controller 700 as shown in FIG. 7). In one implementation, currents are analyzed with I1 representing the current flow through the line current sensors 130 on the line and neutral buses of the first generator with I1 being the vector sum of the currents shown. The high-speed network device 120 communicatively coupled to these respective line current sensors 130 may be configured to communicate the current flow information to one or more other high-speed network devices 120 and/or a controller (e.g., a computing device such as controller 700).

The controller may be configured to calculate the power flow through the line current sensors 130 on the line and neutral buses of the first generator as P1=V*I1*cos Ø1, wherein Ø1 is the angle between the respective bus voltage 'V' and I1. The direction of the current on both the line side line current sensors 130 and the neutral current sensor 130 is same and it enters the line current sensors 130 from the other side of the 'dot'. Therefore, the total current I1 is considered −ve. Since the power fault is causing current to flow from the load bus 140 back to the first generator through the N-G bond and not the Neutral bus, this may be represented as −ve due to the missing current flow.

Currents may be further analyzed with I2 representing the current flow through the line current sensors 130 on the line and neutral buses of the second generator with I2 being the vector sum of the currents shown. The high-speed network devices 120 communicatively coupled to these respective line current sensors 130 can be configured to communicate the current flow information to one or more other high-speed network devices 120 and/or a controller (e.g., a computing device such as controller 700).

The controller may be configured to calculate the power flow through the line current sensors 130 on the line and neutral buses of the second generator as P2=V*I2*cos Ø2, wherein Ø2 is the angle between the respective bus voltage 'V' and I2. As shown on FIG. 1, the current enters the line current sensors 130 of G2 through the 'dot' and goes back to the G2 through N-G bond of G2. Also, some of the G1 fault current also flows through the N-G of G2, to neutral bus 150 and back to G1. This current enters the G2 neutral through the 'dot' and leave the G1 neutral current sensor 130 through the 'dot'. The direction of currents in both the line current sensor 130 and the neutral current sensor 130 is the same and therefore they may be added and considered +ve. Current flowing from the second generator to a load bus 140 may be represented as +ve.

Currents may be further analyzed with I3 representing the current flow through the line current sensor 130 on the bus connecting neutral to ground for the first generator. The high-speed network device 120 communicatively coupled to this respective line current sensor 130 can be configured to communicate the current flow information to one or more other high-speed network devices 120 and/or a controller (e.g., a computing device such as controller 700).

Current flowing from the first generator N-G bond may be represented as +ve as it enters the line current sensor 130 through the 'dot' and leaves the CT from the other side.

Currents may be further analyzed with I4 representing the current flow through the line current sensor 130 on the bus connecting neutral to ground for the second generator. The high-speed network device 120 communicatively coupled to this respective line current sensor 130 can be configured to communicate the current flow information to one or more other high-speed network devices 120 and/or a controller (e.g., a computing device such as controller 700).

Current flowing from the second generator N-G bond may be represented as +ve as it enters the line current sensor 130 through the 'dot' and leaves the line current sensor 130 from the other side.

Under these fault conditions, P1 can therefore be represented as −ve, P2 as +ve, I3 as +ve, and I4 as +ve. The controller can be configured to determine that with this example configuration of components, the negative value of P1 along with positive values of P2, I3 and I4 indicate the ground fault is on the line bus of the first generator (G1). In some implementations, the controller is configured to transmit an alarm and/or alarm condition. In some implementations, the controller is configured to trip the associated breaker 160 in cases where the ground fault current is above the pickup value of the ground fault current. The controller may be configured to calculate the ground fault current as I3+I4.

Figure 3:
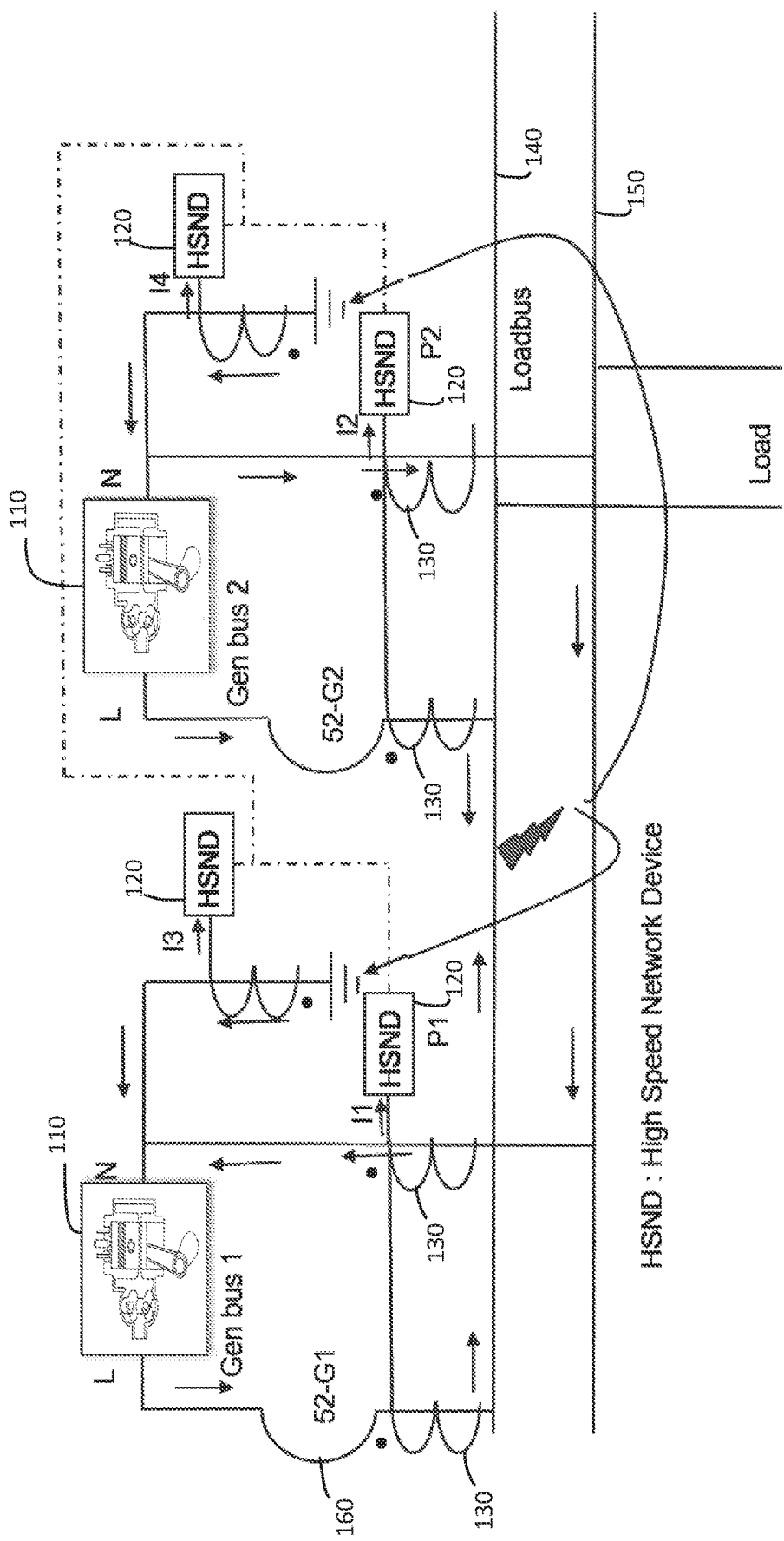
FIG. 3 is a schematic block diagram showing current flow with a ground fault on a load bus in a power system according to an example implementation.

FIG. 3 is a schematic diagram showing current flow in a power system 300 with an illustrated power fault on the load or load common bus for both generators 110 according to an example implementation. The power system 300 shows two power generators 110 each with a corresponding generator bus, various line current sensors 130, high-speed network devices 120 communicatively coupled to one or more of the line current sensors 130, circuit breakers 160, a load bus 140, and a neutral bus 150. Each bus may represent one or more phases of power (e.g., three phase power). In an example implementation, power system 300 shows current sensors 130 installed between the neutral/ground bonds of each generator and on the buses from the load and neutral of each generator to the respective load bus 140 and neutral bus 150.

FIG. 3 shows an example implementation with a power fault (short to ground) on the load bus 140 compromising normal current flow. The current flow in these conditions can be analyzed in a controller (e.g., a controller 700). In one implementation, currents are analyzed with I1 representing the current flow through the line current sensors 130 on the line and neutral buses of the first generator (G1) with I1 being the vector sum of the currents shown. The high-speed network device 120 communicatively coupled to these respective line current sensors 130 may be configured to communicate the current flow information to one or more other high-speed network devices 120 and/or a controller (e.g., a computing device such as controller 700).

The controller may be configured to calculate the power flow through the line current sensors 130 on the line and neutral buses of the first generator as P1=V*I1*cos Ø1, wherein Ø1 is the angle between the respective bus voltage 'V' and I1. The current flows into the line side line current sensor 130 through the 'dot' and it returns to the first generator (G1) through Neutral to Ground (N-G) bond bypassing the neutral current sensor 130 of the first generator bus, 52-G1. Therefore, the vector sum of currents through the current sensors 130 of 52-G1 will be positive. Since the power fault is causing current to flow from the first generator (G1) to load bus 140 back to the first generator (G1), this may be represented as +ve.

Currents may be further analyzed with I2 representing the current flow through the line current sensors 130 on the line and neutral buses of the second generator (G2) with I2 being the vector sum of the currents shown. The high-speed network devices 120 communicatively coupled to these respective line current sensors 130 can be configured to communicate the current flow information to one or more other high-speed network devices 120 and/or a controller (e.g., a computing device such as controller 700).

The controller may be configured to calculate the power flow through the line current sensors 130 on the line and neutral buses of the second generator as P2=V*I2*cos Ø2, wherein Ø2 is the angle between the respective bus voltage 'V' and I2. The current flows into the line side line current sensors 130 through the 'dot' and it returns to the second generator (G2) through Neutral to Ground (N-G) bond bypassing the neutral (N) current sensor 130 of 52-G2. Therefore, the vector sum of currents through the current sensors 130 of 52-G2 will be positive. Current flowing from the second generator (G2) to a load bus 140 may be represented as +ve.

Currents may be further analyzed with I3 representing the current flow through the line current sensor 130 on the bus connecting neutral to ground for the first generator. The high-speed network device 120 communicatively coupled to this respective line current sensor 130 can be configured to communicate the current flow information to one or more other high-speed network devices 120 and/or a controller (e.g., a computing device such as controller 700).

Current enters the current sensor 130 through the 'dot' and leaves the current sensor 130 from the other end. Current flowing from the first generator to a N-G bond may be represented as +ve.

Currents may be further analyzed with I4 representing the current flow through the line current sensor 130 on the bus connecting neutral to ground for the second generator. The high-speed network device 120 communicatively coupled to this respective line current sensor 130 can be configured to communicate the current flow information to one or more other high-speed network devices 120 and/or a controller (e.g., a computing device such as controller 700).

The current enters the current sensor 130 through the 'dot' and leave the current sensor 130 from the other side. Current flowing from the second generator to a N-G bond may be represented as +ve.

Under these fault conditions, P1 can therefore be represented as +ve, P2 as +ve, I3 as +ve, and I4 as +ve. The controller can be configured to determine that with this example configuration of components, the positive value of P1, P2, I3 and I4 indicate the ground fault is on the load bus of the two generators. In some implementations, the controller is configured to transmit an alarm and/or alarm condition. In some implementations, the controller is configured to trip the associated breaker 160 in cases where the ground fault current is above the pickup value of the ground fault current. The controller may also be configured to calculate the ground fault current as I3+I4.

Figure 4:
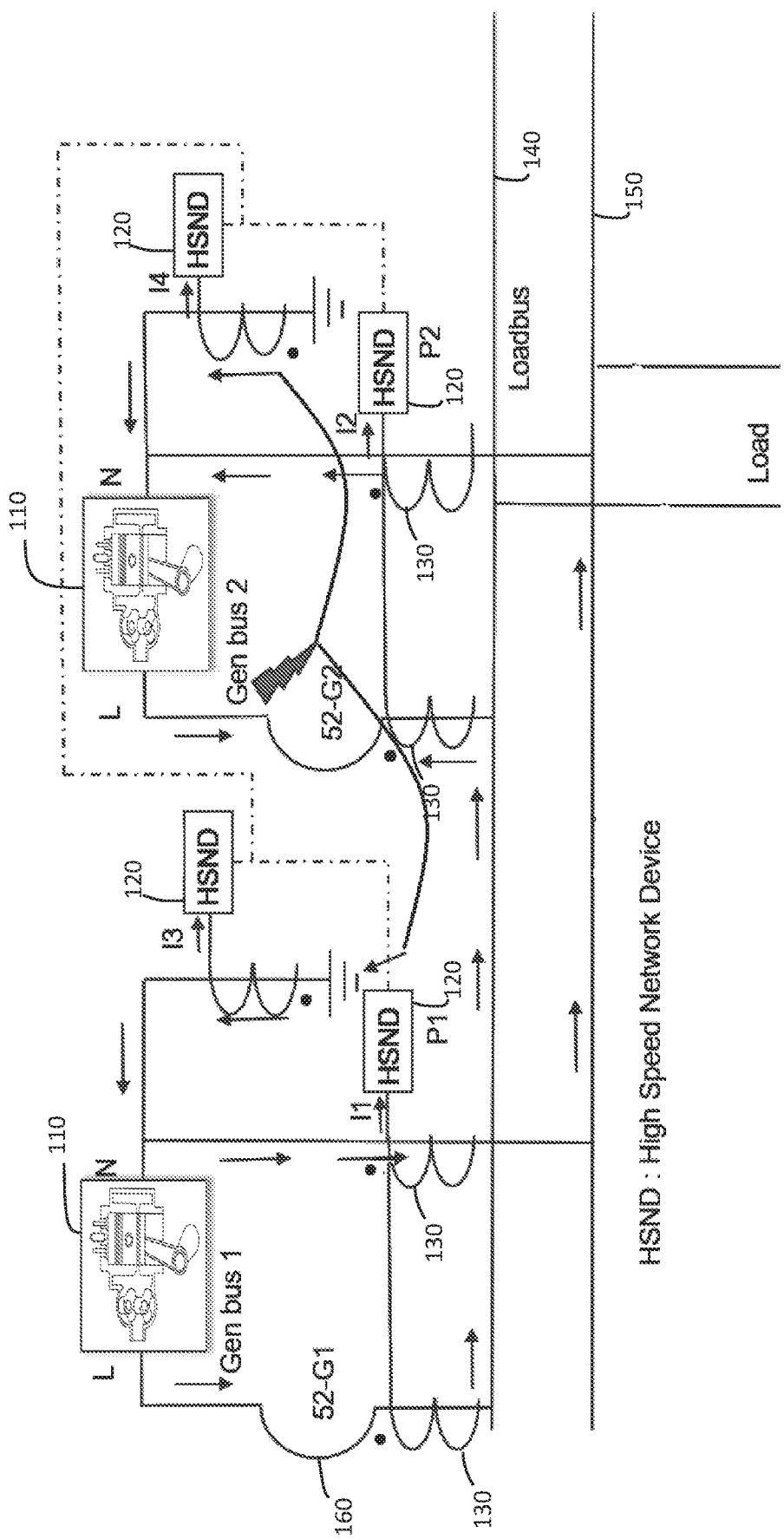
FIG. 4 is a schematic block diagram showing current flow with a ground fault on a second generator bus in a power system according to an example implementation.

FIG. 4 is a schematic diagram showing current flow in a power system 400 with an illustrated power fault on the load bus line for the second generator 110 according to an example implementation. The power system 400 shows two power generators 110 each with a corresponding generator bus, various line current sensors 130, high-speed network devices 120 communicatively coupled to one or more of the line current sensors 130, circuit breakers 160, a load bus 140, and a neutral bus 150. Each bus may represent one or more phases of power (e.g. three phase power). In an example implementation, power system 400 shows current sensors 130 installed between the neutral/ground (N-G) bonds of each generator and on the buses from the load (L) and neutral (N) of each generator to the respective load bus 140 and neutral bus 150.

FIG. 4 shows an example implementation with a power fault (short to ground) compromising normal current flow on the load bus line of the second generator (G2). The current flow in these conditions can be analyzed in a controller (e.g., a controller 700 as shown in FIG. 7). In one implementation, currents are analyzed with I1 representing the current flow through the line current sensors 130 on the line and neutral buses of the first generator with I1 being the vector sum of the currents shown. The high-speed network device 120 communicatively coupled to these respective line current sensors 130 may be configured to communicate the current flow information to one or more other high-speed network devices 120 and/or a controller (e.g., a computing device such as controller 700).

The controller may be configured to calculate the power flow through the line current sensors 130 on the line and neutral buses of the first generator as P1=V*I1*cos Ø1, wherein Ø1 is the angle between the respective bus voltage 'V' and I1. Current flows into the fault from 'dot' side of the line current sensors 130 of 52-G1 to load bus 140, to 52-G2 line side current sensors 130 (leaving the 52-G2 current sensors 130 through the 'dot') and return to the G1 through the N-G bond on the G1. As the current does not return through the neutral current sensor 130 of the 52-G1, the vector sum of the line current sensors 130 current and the neutral current on 52-G1 current sensors 130 will be positive. Since the power fault is causing current to flow from the first Generator to the load bus 140 back to the first generator, this may be represented as +ve.

Currents may be further analyzed with I2 representing the current flow through the line current sensors 130 on the line and neutral buses of the second generator with I2 being the vector sum of the currents shown. The high-speed network devices 120 communicatively coupled to these respective line current sensors 130 can be configured to communicate the current flow information to one or more other high-speed network devices 120 and/or a controller (e.g., a computing device such as controller 700).

The controller may be configured to calculate the power flow through the line current sensors 130 on the line and neutral buses of the second generator as P2=V*I2*cos Ø2, wherein Ø2 is the angle between the respective bus voltage 'V' and I2. Current flows from the second Generator (G2) to the power fault bypass the line side current sensors 130 of the second Generator (G2). Part of the return current flows through the N-G bond on the second Generator (G2) and rest of the return current flows through the N-G bond of the first Generator (G1), to the neutral (N) current sensor 130 of the first Generator (G1) through the 'dot' side, to the neutral current sensor 130 of the second Generator (G2) through the side opposite to the 'dot' and back to the second Generator (G2). Current in the line side current sensors 130 of the second Generator (G2) is the fault current supplied by first Generator (G1) and it flows into the fault through the line side current sensors 130 of the second Generator (G2), from the side opposite to the 'dot'. The currents in the line side current sensors 130 and neutral (CT) sensor on second Generator (G2) add up and considered –ve as they enter the current sensors 130 from the opposite end of the 'dot'. Current flowing from the second generator (G2) to a load bus 140 may be represented as –ve.

Currents may be further analyzed with I3 representing the current flow through the line current sensor 130 on the bus connecting neutral to ground (N-G) for the first generator (G1). The high-speed network device 120 communicatively coupled to this respective line current sensor 130 can be configured to communicate the current flow information to one or more other high-speed network devices 120 and/or a controller (e.g., a computing device such as controller 700).

Current flowing from the first generator (G1) to a N-G bond may be represented as +ve as current enters the N-G bond current sensor 130 of the first Generator (G1) through the 'dot' of the line current sensor 130.

Currents may be further analyzed with I4 representing the current flow through the line current sensor 130 on the bus connecting neutral to ground for the second generator. The high-speed network device 120 communicatively coupled to this respective line current sensor 130 can be configured to communicate the current flow information to one or more other high-speed network devices 120 and/or a controller (e.g., a computing device such as controller 700).

The controller may be configured to calculate the power flow through the line current sensor 130 on the bus connecting neutral to ground for the second generator as P4=V*I4*cos Ø4, wherein Ø4 is the angle between the respective bus voltage 'V' and I4. Current flowing from the second generator (G2) to a N-G bond may be represented as +ve as it enters the N-G bond line current sensor 130 through the 'dot' end and leaves the line current sensor 130 from the other end.

Under these fault conditions, P1 can therefore be represented as +ve, P2 as –ve, I3 as +ve, and I4 as +ve. The controller can be configured to determine that with this example configuration of components, the positive value of P1 along with negative value of P2, and positive values of I3 and I4 indicate the ground fault is on the line bus of the second generator (G2). In some implementations, the controller is configured to transmit an alarm and/or alarm condition. In some implementations, the controller is configured to trip the associated breaker 160 in cases where the ground fault current is above the pickup value of the ground fault current. The controller may be configured to calculate the ground fault current as I3+I4.

Various scenarios as illustrated in FIGS. 1-4 for power flow are summarized in the following table:

|  | No fault | Genbus 1 fault | Loadbus fault | Genbus 2 fault |
|---|---|---|---|---|
| Power flow through 1st generator Current Sensor (P1) | +ve | –ve | +ve | +ve |
| Power flow through 2nd generator Current Sensor (P2) | –ve | +ve | +ve | –ve |

|  | No fault | Genbus 1 fault | Loadbus fault | Genbus 2 fault |
| --- | --- | --- | --- | --- |
| Current flow through 1$^{st}$ generator Neutral Current Sensor (I3) | +ve | +ve | +ve | +ve |
| Current flow through 2$^{nd}$ generator Neutral Current Sensor (I4) | −ve | +ve | +ve | +ve |

Figure 5:
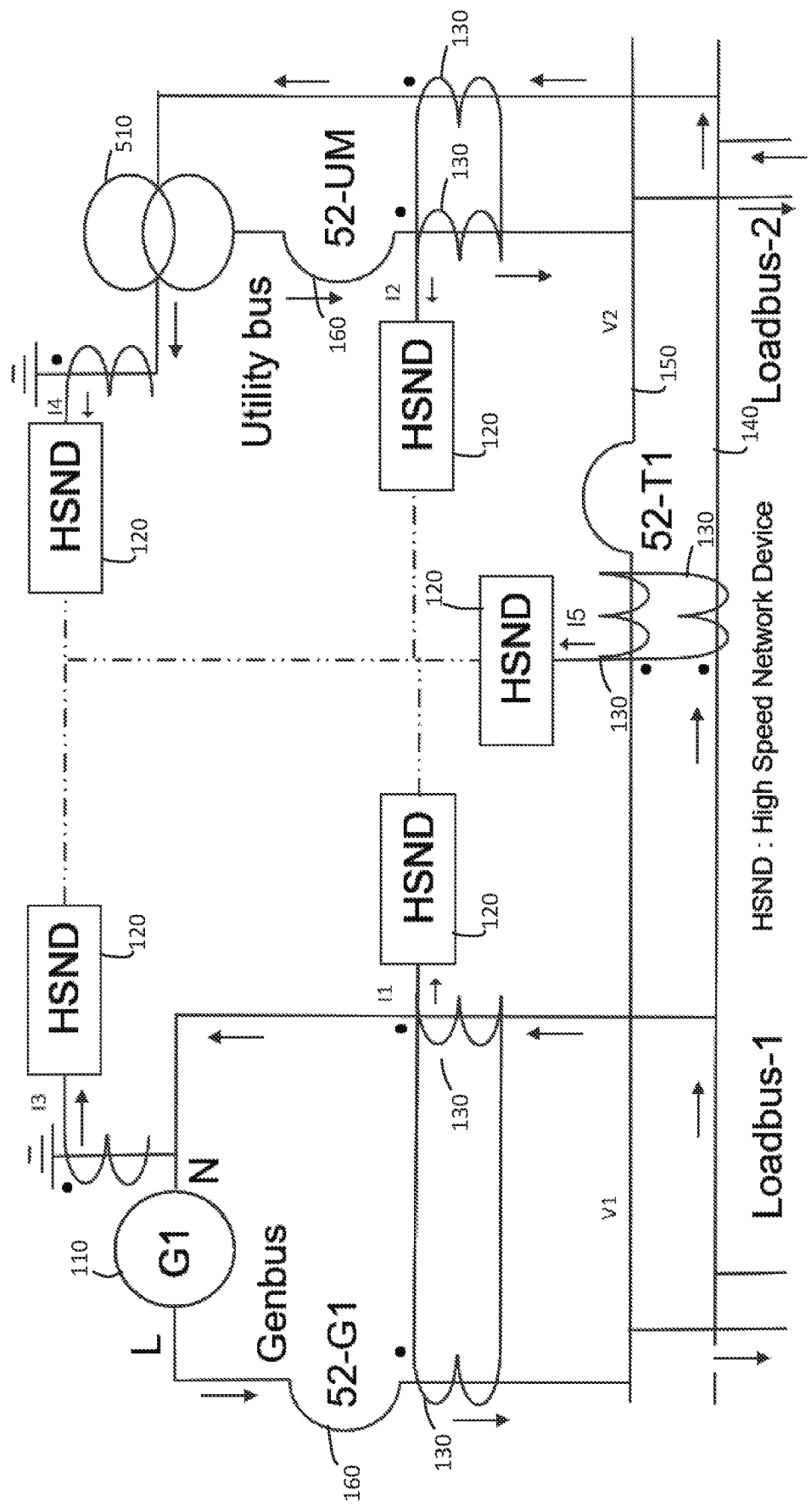
FIG. 5. is a schematic block diagram showing normal power flow in a transfer pair with a Tie breaker and multiple point ground in a power system according to an example implementation.

FIG. 5 is a schematic diagram showing normal power flow in a transfer pair with a Tie breaker and multiple point ground in a power system 500 with generator and utility according to an example implementation. Power system 500 comprises a transfer pair with a tie in a multiple point ground system. The power system 500 shows a power generator 110 and a utility 510 each with a respective generator bus and utility bus, various line current sensors 130, high-speed network devices 120 communicatively coupled to one or more of the line current sensors 130, circuit breakers 160, and two load buses 140, and a neutral bus 150. Each bus may represent one or more phases of power (e.g. three phase power). In an example implementation, power system 100 shows current sensors 130 installed between the neutral/ground bonds of the generator 110 and on the buses from the load and neutral of the generator 110 to the respective load bus 140 and neutral bus 150. Additionally, power system 100 shows current sensors 130 installed between the neutral/ground bonds of the generator 110 and on the buses from the load and neutral of the utility 510 to the respective load bus 140 and neutral bus 150.

FIG. 5 shows an example implementation with normal current flow. Normal current flow can be analyzed in a controller (e.g., a controller 700). In one implementation, currents are analyzed with I1 representing the current flow through the line current sensors 130 on the line and neutral buses of the generator 110 with I1 being the vector sum of the currents shown. The high-speed network device 120 communicatively coupled to these respective line current sensors 130 may be configured to communicate the current flow information to one or more other high-speed network devices 120 and/or a controller (e.g., a computing device such as controller 700).

Further analysis of the power flow through the line current sensors can be done similarly to the analyses above for FIGS. 1-4. Various scenarios similar to those analyzed for FIGS. 1-4 are summarized in the following table:

|  | Normal current flow | Fault on Genbus | Fault on load bus 1 | Fault on load bus 2 | Fault on Utility bus |
| --- | --- | --- | --- | --- | --- |
| Power through Gen Current Sensors (P1) | +ve | −ve | +ve | +ve | +ve |
| Power through utility Current Sensors (P2) | −ve | +ve | +ve | +ve | −ve |
| Current through Gen neutral Current Sensor (I3) | +ve | +ve | +ve | +ve | +ve |
| Current through Gen neutral Current Sensor (I4) | −ve | +ve | +ve | +ve | +ve |
| Power through Tie Current Sensors (P5) | −ve | −ve | −ve | +ve | +ve |

Figure 6:
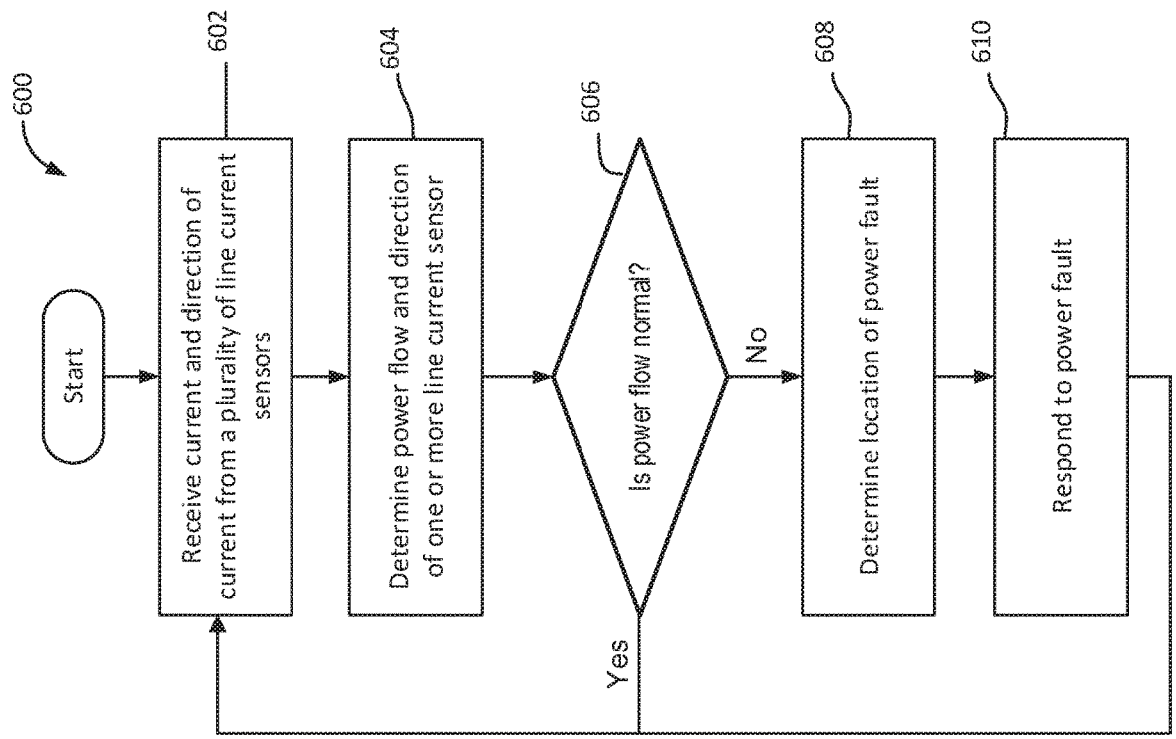
FIG. 6 is a schematic flow diagram of a method of determining a location of a power fault in a power system according to an example implementation.

FIG. 6 illustrates a method 600 of determining a location of a power fault in a power system according to an example implementation. The operations of method 600 presented below are intended to be illustrative. In some implementations, method 600 may be accomplished with one or more additional operations not described, and/or without one or more of the operations discussed. Additionally, the order in which the operations of method 600 are illustrated in FIG. 6 and described below is not intended to be limiting.

In some implementations, method 600 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 600 in response to instructions stored electronically on an electronic storage medium. The one or more processing devices may include one or more devices configured through hardware, firmware, and/or software to be specifically designed for execution of one or more of the operations of method 600. For example, the one or more processing devices may include a controller 700 as illustrated in FIG. 7.

An operation 602 may include receiving current and/or direction of current from a plurality of line current sensors. In some implementations, values for the current are received over a network device (e.g., a high-speed network device 120). Current values may be received from a plurality of line current sensors (e.g., line current sensors 130). The plurality of line current sensors may be installed on various buses of a power system such as generator line buses, neutral buses, neutral to ground connections, etc. In some implementations, the network devices (e.g., high-speed network devices 120) communicate the current values to one or more other high-speed network devices 120 before being received. In some implementations, the current values measured by the line current sensors 130 are only received from the network devices 120 when the current values are above a threshold value. In some implementations, the plurality of line current sensors sends a respective value indicative of direction of current flow and may or may not additional send a value of current.

An operation 604 may include determining power flow and direction of one or more of the plurality of line current sensors (e.g., line current sensors 130). The power flow and direction can be calculated through the line current sensors 130 installed on the respective associated bus For example, power flow may be calculated as P=V*I*cos Ø, wherein Ø is the angle between the respective bus voltage 'V' of the bus where the line current sensor 130 is installed and I, the current on the respective bus. The plurality of line current sensors may be installed on various buses of a power system such as generator line buses, neutral buses, neutral to ground connections, etc.

An operation 606 may include determining if current flow is normal. The direction of power flow through a plurality of line current sensors (e.g., line current sensors 130) such as generator line buses, neutral buses, neutral to ground connections, etc. is matched to patterns of power flow direction based on the respective configuration of the power system to determine if the current flow is normal.

An operation 608 may include determining location of power fault. The direction of power flow through a plurality of line current sensors (e.g., line current sensors 130) such as generator line buses, neutral buses, neutral to ground connections, etc. determined at 606 can be matched to patterns of power flow direction. The matched patterns of power flow direction for the respective configuration of the power system can determine the location (e.g., which bus) a power fault is located.

An operation 610 may include responding to a power fault. In some implementations, responding to a power fault comprises activating an alarm based on determining the power fault has occurred. The alarm may include a location of the power fault. In some implementations, an alarm comprises setting an alert flag and/or sending a message over a high-speed network (e.g., using one or more high-speed network devices 120). In some implementations, responding to a power fault comprises tripping a circuit breaker (e.g., circuit breaker 160) installed on a respective bus of the power system, the circuit breaker chosen based on the location of the power fault.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

FIG. 7 is a schematic block diagram of an embodiment of a controller 700. In some implementations, one or more controllers may be part of a generator set including one or more power generators 110. The controller 700 includes a processor 702, a memory 704 or other computer readable medium, and a transceiver 712. It should be understood that the controller 700 shows only one implementation of a control circuitry.

The processor 702 can include a microprocessor, programmable logic controller (PLC) chip, an ASIC chip, or any other suitable processor. The processor 702 is in communication with the memory 704 and configured to execute instructions, algorithms, commands or otherwise programs stored in the memory 704.

The memory 704 includes any of the memory and/or storage components discussed herein. For example, memory 704 may include RAM and/or cache of processor 702. Memory 704 may also include one or more storage devices (e.g., hard drives, flash drives, computer readable media, etc.) either local or remote to controller 700. The memory 704 is configured to store look up tables, algorithms or instructions.

For example, the memory 704 includes a current analysis circuitry 704a, a power flow circuitry 704b, and a power fault location circuitry 704c. The current analysis circuitry 704a may be configured to analyze values of current flow in network data via transceiver 712. Current flow analysis may include analyzing values of current associated with line current sensors 130 between the line and neutral buses of one or more generators 110, between the neutral and ground bonds of one or more generators 110, between the load bus and neutral bus of each respective generator 110 of one or more generators 110 and a respective load bus and/or neutral bus, as well as between other possible buses of the system.

The power flow circuitry 704b may be configured to calculate the power flow through the line current sensors 130 on a respective line and/or neutral bus of a respective generator 110 as $P=V*I*\cos \emptyset$, wherein $\emptyset$ is the angle between the respective bus voltage 'V' and current 'I'.

The power fault location circuitry 704c may be configured to receive current and direction of current from a plurality of line current sensors. Current values may be received from a plurality of line current sensors (e.g., line current sensors 130) through transceiver 178. The power fault location circuitry 704c may further be configured to determine power flow and direction of one or more of the plurality of line current sensors (e.g., line current sensors 130). The power flow and direction can be calculated through the line current sensors 130 installed on the respective associated bus For example, power flow may be calculated as $P=V*I*\cos \emptyset$, wherein $\emptyset$ is the angle between the respective bus voltage 'V' of the bus where the line current sensor 130 is installed and I, the current on the respective bus. The plurality of line current sensors may be installed on various buses of a power system such as generator line buses, neutral buses, neutral to ground connections, etc.

The power fault location circuitry 704c may be configured to determine if current flow is normal. The direction of power flow through a plurality of line current sensors (e.g., line current sensors 130) such as generator line buses, neutral buses, neutral to ground connections, etc. is matched to patterns of power flow direction based on the respective configuration of the power system to determine if the current flow is normal.

The power fault location circuitry 704c may be configured to determine location of a power fault. The direction of power flow through a plurality of line current sensors (e.g., line current sensors 130) such as generator line buses, neutral buses, neutral to ground connections, can be matched to patterns of power flow direction. The matched patterns of power flow direction for the respective configuration of the power system can determine the location (e.g., which bus) a power fault is located.

The power fault location circuitry 704c may be configured to respond to a power fault. In some implementations, responding to a power fault comprises activating an alarm based on determining the power fault has occurred. The alarm may include a location of the power fault. In some implementations, an alarm comprises setting an alert flag and/or sending a message over a high-speed network (e.g., using one or more high-speed network devices 120). In some implementations, responding to a power fault comprises tripping a circuit breaker (e.g., circuit breaker 160) installed on a respective bus of the power system, the circuit breaker chosen based on the location of the power fault.

It should be noted that the term "example" as used herein to describe various implementations is intended to indicate that such implementations are possible examples, representations, and/or illustrations of possible implementations (and such term is not intended to connote that such implementations are necessarily extraordinary or superlative examples).

The terms "coupled," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary implementations are illustrative only. Although only a few implementations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Additionally, it should be understood that features from one implementation disclosed herein may be combined with features of other implementations disclosed herein as one of ordinary skill in the art would understand. Other substitutions, modifications, changes and omissions may also be made in the design, operating conditions and arrangement of the various exemplary implementations without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A power system comprising:
   a plurality of generators operatively connected to a respective bus;
   a respective line current sensor between each respective bus of each generator and a load bus;
   a line current sensor between neutral and ground for a first of the plurality of generators;
   a respective network device operatively coupled to each respective line current sensor; and
   one or more controllers configured to:
      receive, from the network devices, respective power flow directions as measured by the line current sensors, and
      determine a potential location of a power fault based on the respective power flow directions at each respective line current sensor and the line current sensor between neutral and ground.

2. The power system of claim 1, further comprising:
   a respective line current sensor between a neutral bus and each of a respective neutral bus of each of the plurality of generators.

3. The power system of claim 1, wherein one of the one or more controllers is a controller integrated into one of the plurality of generators.

4. The power system of claim 2, wherein the one or more controllers is further configured to:
   receive, from respective network devices, current values measured by the line current sensors between the neutral bus and each of the respective neutral bus of each of the plurality of generators, and
   determine the location of the power fault further based on respective directions of power flow at each of the line current sensors between the neutral bus and each of the respective neutral bus of each of the plurality of generators.

5. The power system of claim 2, wherein the one or more controllers is further configured to determine no power fault present in the power system based on the respective directions of power flow at each respective line current sensor.

6. The power system of claim 2, wherein the one or more controllers are further configured to:
   receive a first value of current flow from a first line current sensor installed on a generator bus of the power system,
   receive a second value of current flow from a second line current sensor installed on a load bus of the power system,
   determine a first direction of power flow in the first line current sensor using the first value of current flow,
   determine a second direction of power flow in the second line current sensor using the second value of current flow, and
   determine a power fault is located on one of the generator bus of the power system or the load bus of the power system based on the first direction of power flow and the second direction of power flow.

7. The power system of claim 6, wherein the one or more controllers are further configured to:
   receive a third value of current flow from a third line current sensor installed on a second generator bus of the power system,
   determine a third direction of power flow in the third line current sensor using the third value of current flow, and
   wherein, determining the power fault is located on one of the generator bus of the power system or the load bus of the power system is further based on the third direction of power flow.

8. The power system of claim 7, wherein the one or more controllers are further configured to determine if the power fault is located on the second generator bus of the power system.

9. The power system of claim 6, further comprising a circuit breaker installed on the generator bus, wherein the one or more controllers are further configured to:
   determine the power fault is located on the generator bus of the power system, and
   trip the circuit breaker installed on the generator bus of the power system.

10. The power system of claim 1, wherein the current values measured by the line current sensors are only received from the network devices when the current values are above a threshold value.

11. The power system of claim 2, wherein the one or more controllers are further configured to:
    receive a first value of current flow from a first line current sensor installed between a neutral bus and a first neutral bus of a first generator of the plurality of generators,
    receive a second value of current flow from a second line current sensor installed between the neutral bus and a second neutral bus of a second generator of the plurality of generators,
    receive a third value of current flow from the line current sensor between neutral and ground,
    determine a first direction of power flow in the first line current sensor using the first value of current flow,
    determine a second direction of power flow in the second line current sensor using the second value of current flow,
    determine a third direction of power flow in the second line current sensor using the third value of current flow, and
    determine a power fault is located on one of a generator bus of the first generator, a generator bus of the second generator or the load bus of the power system based on the first direction of power flow, the second direction of power flow, and the third direction of power flow.

12. A method of determining a fault in a power system, executing on a controller, the method comprising:
receiving a first value indicative of current flow from a first current sensor installed on a first bus of the power system, wherein the first current sensor is between neutral and ground;
receiving a second value indicative of current flow from a second current sensor installed on a second bus of the power system;
determining a first direction of power flow in the first current sensor using the first value indicative of current flow;
determining a second direction of power flow in the second current sensor using the second value indicative of current flow; and
determining a power fault is located on one of the first bus of the power system or the second bus of the power system based on the first direction of power flow and the second direction of power flow.

13. The method of claim 12, wherein the first bus is operatively connected to a first generator and the second bus is operatively connected to a second generator.

14. The method of claim 12, further comprising:
receiving a third value indicative of current flow from a third current sensor installed on a third bus of the power system;
determining a third direction of power flow in the third current sensor using the third value indicative of current flow; and
wherein, determining the power is located on one of the first bus of the power system or the second bus of the power system is further based on the third direction of power flow.

15. The method of claim 12, wherein the first value indicative of current flow from the first current sensor and the second value indicative of current flow from the second current sensor are one of (1) a respective value of an amount of current or (2) a respective value of current flow direction.

16. The method of claim 12, further comprising: tripping a respective circuit breaker operatively connected to the first bus of the power system or the second bus of the power system based on determining the power fault is located on one of the first bus of the power system or the second bus of the power system.

17. The method of claim 12, further comprising:
receiving a third value indicative of current flow from a third current sensor installed on a third bus of the power system;
receiving a fourth value indicative of current flow from a fourth current sensor installed on a fourth bus of the power system;
receiving a fifth value indicative of current flow from a fifth current sensor installed on a fifth bus of the power system;
determining a third direction of power flow in the third current sensor using the third value indicative of current flow;
determining a fourth direction of power flow in the fourth current sensor using the fourth value indicative of current flow;
determining a fifth direction of power flow in the fifth current sensor using the fifth value indicative of current flow; and
wherein the first bus is a generator bus, the second bus is a generator neutral bus, the third bus is a utility bus, the fourth bus is a utility neutral bus, and the fifth bus is a tie bus; and
determining a power fault is located on one of the generator bus, a load bus, or the utility bus based on the first direction of power flow, the second direction of power flow, the third direction of power flow, the fourth direction of power flow, and the fifth direction of power flow.

18. A non-transitory computer-readable storage medium having instructions embodied thereon, the instructions being executable by one or more processors to perform operations for determining a fault in a power system, the operations comprising:
receiving a first value of current flow from a first current sensor installed on a first bus of the power system, wherein the first current sensor is between neutral and ground;
receiving a second value of current flow from a second current sensor installed on a second bus of the power system;
determining a first direction of power flow in the first current sensor using the first value of current flow;
determining a second direction of power flow in the second current sensor using the second value of current flow; and
determining a power fault is located on one of the first bus of the power system or the second bus of the power system based on the first direction of power flow and the second direction of power flow.

19. The computer-readable storage medium of claim 18, wherein the first bus is operatively connected to the first generator and the second bus is operatively connected to a second generator.

20. The computer-readable storage medium of claim 18, wherein the operations further comprise:
receiving a third value of current flow from a third current sensor installed on a third bus of the power system;
determining a third direction of power flow in the third current sensor using the third value of current flow; and
wherein, determining the power is located on one of the first bus of the power system or the second bus of the power system is further based on the third direction of power flow.

21. The computer-readable storage medium of claim 18, wherein the operations further comprise activating an alarm based on determining the power fault is located on one of the first bus of the power system or the second bus of the power system.

22. The computer-readable storage medium of claim 18, wherein the operations further comprise tripping a respective circuit breaker operatively connected to the first bus of the power system or the second bus of the power system based on determining the power fault is located on one of the first bus of the power system or the second bus of the power system.

* * * * *

UNITED STATES PATENT AND TRADEMARK OFFICE
CERTIFICATE OF CORRECTION

PATENT NO. : 11,016,135 B2
APPLICATION NO. : 16/202571
DATED : May 25, 2021
INVENTOR(S) : Shubhranshu Verma and Julie M. Delago It is certified that error appears in the above-identified patent and that said Letters Patent is hereby corrected as shown below:

In the Claims

At Column 16, Line 63, delete "second"
At Column 16, Line 64, after sensor, insert --between neutral and ground--
At Column 17, Line 33, after power, insert --fault--
At Column 18, Line 38, delete "connected to the first" and insert --connected to a first--
At Column 18, Line 47, after power, insert --fault--

Signed and Sealed this
Seventeenth Day of September, 2024

Katherine Kelly Vidal
*Director of the United States Patent and Trademark Office*